United States Patent [19]

Rostoker

[11] Patent Number: 5,340,771
[45] Date of Patent: Aug. 23, 1994

[54] TECHNIQUES FOR PROVIDING HIGH I/O COUNT CONNECTIONS TO SEMICONDUCTOR DIES

[75] Inventor: Michael D. Rostoker, Boulder Creek, Calif.

[73] Assignee: LSI Logic Corporation, Milpitas, Calif.

[21] Appl. No.: 33,718

[22] Filed: Mar. 18, 1993

[51] Int. Cl.⁵ ............................................. H01L 21/60
[52] U.S. Cl. ................... 437/209; 437/211; 437/214; 437/217; 437/220
[58] Field of Search ............... 437/220, 209, 217, 214, 437/211

[56] References Cited

U.S. PATENT DOCUMENTS

| | | | |
|---|---|---|---|
| 3,200,364 | 4/1993 | Loh | 437/211 |
| 4,897,708 | 1/1990 | Clements. | |
| 4,987,100 | 1/1991 | McBride et al. | 437/220 |
| 5,034,349 | 7/1991 | Landis | 437/220 |
| 5,172,214 | 12/1992 | Casto | 437/220 |
| 5,206,188 | 4/1993 | Hiroi et al. | 437/217 |

FOREIGN PATENT DOCUMENTS

0314437A1  5/1989  European Pat. Off. .
3233195A1  3/1983  Fed. Rep. of Germany .

OTHER PUBLICATIONS

Computer Design, ASICs & ASIC Design Tools, Oct., 1991 *Emphasis Shifts From Density To I/O In Low-Density Arrays*, Barbara Tuck, Senior Editor, pp. 42 and 45.

*Primary Examiner*—Tom Thomas
*Assistant Examiner*—Kevin M. Picardat
*Attorney, Agent, or Firm*—Gerald E. Linden

[57] ABSTRACT

Techniques for providing semiconductor packages capable of forming connections to "high I/O" semiconductor dies is described, wherein there are at least two distinct pluralities of conductive lines. Leadframe-type packages and substrate-based package embodiments are described.

23 Claims, 3 Drawing Sheets

TECHNIQUES FOR PROVIDING HIGH I/O COUNT CONNECTIONS TO SEMICONDUCTOR DIES

TECHNICAL FIELD OF THE INVENTION

The invention relates to integrated circuit devices, and more particularly to integrated circuit packages and packaging techniques.

BACKGROUND OF THE INVENTION

Semi conductor process technology has been progressing along a path towards ever-smaller device geometries, providing dramatic increases in the amount of circuitry which can be placed on a single-chip (i.e., increased circuit density). In general, the integrated circuit technology made available to the public in the form of custom and semi-custom devices has followed this same path, providing ever-greater numbers of gates on a single chip at ever-lower costs. One particular type of semi-custom integrated circuit device is known as an ASIC (Application Specific Integrated Circuit), which typically includes standard-cell and gate-array technologies. It is now practical to provide ASICs with hundreds of thousands of gates, even in relatively low volumes.

To some extent, ASIC technology is the beneficiary of process technology advances in other areas such as memory and microprocessor technology. Trends in these areas have also been towards smaller device geometries and higher circuit density. Memory technology, particularly DRAM (Dynamic Random-Access-Memory) technology now routinely provides four to sixteen million bits of storage on a single memory chip. Microprocessor technology has advanced to the point where million-gate microprocessors are routinely available.

The trend in newer microprocessor designs has been towards increasing parallelism, both internally and externally. Internally, more operations are performed simultaneously. Externally, microprocessor bus-widths have increased from a typical 8-bit bus width in the late 1970's to bus-widths of 64 bits and more today. These wider buses, however, place heavy demands on circuitry external to the microprocessor.

The above-referenced trends have generally been accompanied by increased demand for input/output (I/O) connections to the chip. For example, as buswidths of microprocessors have increased, the emphasis of most ASIC users has shifted from circuit density to large numbers of I/O "pins" or connections in what would seem, at first, to run contrary to the process technology trends. The extremely wide processor buses necessitate wide buffering schemes, specialized interfaces to peripheral devices and memories with bus widths different than the processor bus width, and other specialized processor support circuitry. As a result, many ASIC users choose ASIC configurations with relatively small numbers of gates (e.g., 15,000, where 100,000 gate ASICs are available) but with relatively large numbers of I/O pins (e.g., 200 or more I/O pins).

Using early ASIC designs, an ASIC user would be forced to choose an ASIC with significantly larger circuit area than was needed, because the relatively large I/O pads (bond pads) on ASIC chips were limited in number by the amount of die "periphery" available (bond pads are usually located along the edges of a die). In response to this, some ASIC manufacturers now offer various "high I/O" ASIC configurations. Among these are NEC Electronics of Mountain View, Calif., and Hitachi America of Brisbane, Calif.

In an article entitled "Emphasis shifts from density to I/O in low-density arrays", Computer Design, October 1991, this trend is described. As described therein, NEC Electronics' CMOS-6V gate arrays have circuit densities of from approximately 5,000 to 30,000 gates and I/O densities of from 140 to 220 I/O pads. This is accomplished by reducing the I/O pad pitch (providing smaller bond pads). Hitachi America provides a CMOS HC62G series which has circuit densities of from 14,000 to 35,000 gates and from 160 to 240 I/O pads by reducing I/O pad pitch and by staggering the I/O pads in two rows along the edges of the ASIC dies.

As microprocessor bus widths and computing parallelism increase, the need for even greater numbers of I/O pads on ASICs is becoming apparent.

Techniques for providing large numbers of I/O pads on a semiconductor die, relative to its circuit area are described in co-pending, commonly owned U.S. patent application Ser. No. 07/916,328 filed on Jul. 17, 1992 by Rostoker, incorporated herein by reference. This application describes "certain non-square" die shapes which have a greater ratio of die periphery to die area than rectangular dies.

Additional techniques for providing increased I/O pad density are described in co-pending commonly owned U.S. patent application Ser. No. 07/935,449 filed on Aug. 25, 1992 by Rostoker, incorporated herein by reference. This application describes "certain non-square" bond pads, which can be arranged with greater density than square bond pads.

Another technique for providing large numbers of I/O pads involves providing semiconductor dies with bond pads (electrical connection points) disposed on both surfaces of the die. Dies of this type are described in co-pending commonly owned U.S. patent application Ser. No. 07/975,185, filed on Nov. 12, 1992 by Rostoker, incorporated herein by reference.

While many techniques have been proposed for providing large numbers of I/O pads on semiconductor dies, particularly ASICs, semiconductor packaging has remained relatively unchanged. Typically, connection points (e.g., "pins" or leads) are disposed on the outer surface of the package for establishing electrical connections to a die contained within the package. The "pins" are connected to the die via conductive traces or lines which fan into the area in the immediate vicinity of the die. This area is referred to as the "die-receiving area" of the package. While packages are available with hundreds of pins, these are generally designed for large dies with relatively large I/O pad pitch, and provide a relatively large die-receiving area. It is often difficult to provide the required densely spaced conductive traces in a small die receiving area, since the conductive traces are extremely close together (low pitch), and often need to 'fan-in' towards the die-receiving area.

Leadframe-type packages (e.g., TAB—Tape Automated Bonding) are particularly strained by fine (low) I/O pitch, since it is extremely difficult or impossible to provide a conductive leadframe with any kind of structural integrity when the leads become too small. When a large die size is used in conjunction with a leadframe-type package, the leads are spaced farther apart (and therefore may be larger) than when a small die size with the same number of I/O points is used. The most desirable and least expensive leadframes are "punched" out of a sheet of metal. High lead density, however, requires more expensive techniques (e.g. chemical etching) to produce leadframes.

Other approaches to high I/O density include multi-tier ceramic packages.

DISCLOSURE OF THE INVENTION

It is a general object of the present invention to provide an improved technique for packaging semiconductor devices, particularly small devices with a large number of I/O connections required.

It is another object of the present invention to provide semiconductor device packages which can accept "high I/O" semiconductor dies.

It is another object of the present invention to provide semiconductor device packages capable of supporting very large numbers of connections to relatively small semiconductor dies, such as numbers of connections greater than 500, 600, 700, 800, 900, or 1000.

For the purposes of this specification, a "high I/O semiconductor die" is defined as a die incorporating high-density I/O connection techniques, including double-sided dies, single-sided dies with fine I/O pitch, dies with staggered rows of I/O pads, dies with "interior" (versus peripheral) I/O connection points, and the like. Points on the die to which connections are made are referred to as "bond pads", whether they be pads per se, for wire bonding or the like, or whether they be bumps or the like for effecting connections to conductive leads or traces. High I/O semiconductor dies include dies having greater than "n" bond pads, where "n" is, for example, 500, 600, 700, 800, 900, or 1000.

For purposes of this specification, a "high I/O semiconductor device package" is defined as a semiconductor device package designed to provide a large number of connections to a high I/O semiconductor die. High I/O semiconductor packages include packages having greater than "n" 'bond sites' for connecting to a die, where "n" is, for example, 500, 600, 700, 800, 900, or 1000. Evidently, there is requirement that there be as many 'bond sites' in the package as there are 'bond pads' on the semiconductor die.

Generally, the present invention provides package connections to high I/O semiconductor dies by providing at least a first plurality and a second plurality of bond sites on a package substrate or leadframe to which electrical connections may be made.

Generally, the packaging techniques set forth below involve some number of conductive lines, which are either leads are traces, which generally 'fan-in' towards and define a 'die-receiving area'.

According the invention, a technique for packaging "high I/O" semiconductor device package having at least a first plurality and a distinct second plurality of conductive lines, wherein each of the first and second plurality of conductive lines make connection to a semiconductor die in a distinct plane.

In one embodiment of the invention, a first plurality of bond sites is provided by inner ends of the first set of conductive lines which are disposed on a first major surface of a substrate and which fan-in to within a die-receiving area. A first set of bond pads (balls) around a periphery of a die, on one surface of the die, connect to the first plurality of bond sites. A second plurality of conductive lines, on the same major surface of the substrate, fans-in towards the die-receiving area, and is interposed between the first plurality of conductive lines, and stops short of the die-receiving area. A second set of bond pads around the periphery of the die, on another opposite surface of the die, are connected by bond wires to bond sites on the ends of the second conductive lines. In this manner, two planes of connectivity are established, and the number of I/O connections that can be made to a die is greatly increased.

In another embodiment of the invention, the first and second pluralities of conductive lines are provided on the same major surface of the substrate. The first conductive lines extend to the die, and are connected to bond pads on one side of the die. The second set of conductive lines are bent out-of-plane, are interposed between the first set of conductive lines, and stop short of the die. A second substrate is provided with a plurality of conductive traces which extend from bond sites on the inner ends of the second conductive lines to bond pads on the opposite side of the die. The second substrate establishes the second plane of connectivity.

In another embodiment of the invention, a first plurality of conductive lines are provided on an opposite surface of a substrate from a second plurality of conductive lines. This establishes two planes of connectivity. The first plurality of conductive lines are directly connected to a first set of bond pads on one side of the die. The substrate is provided with an opening in the die receiving area, underneath the die. The second plurality of conductive lines is connected by bond wires to a second set of bond pads which are disposed in a central area of the die, on the same side of the die as the first set of bond pads. A heat sink can extend through the opening in the second substrate to draw heat from the die.

In another embodiment, three pluralities of conductive lines are provided. Two of the pluralities of conductive lines are on one side of the substrate, and connect to bond pads as in previous embodiments. The third set of conductive lines are on an opposite side of the substrate, and connect through a hole in the substrate to bond pads located in a central area of the die.

According to an aspect of the invention, the packaging technique of this invention provides a high absolute number of connections for a high I/O semiconductor die—for example, at least 500, 600, 700, 800, 900, or 1000 connections.

Other objects, features and advantages of the invention will become apparent in light of the following description thereof.

BRIEF DESCRIPTION OF THE DRAWINGS

FIG. 1B is a top view of the package portion shown in FIG. 1a.

FIG. 1C is a cross-sectional view of an alternate embodiment of the package portion of FIG. 1a.

FIG. 2B is a top view of the package portion shown in FIG. 2a.

FIG. 3B is a bottom view of the package portion shown in FIG. 3a.

FIG. 3C is a cross-sectional view of an alternate embodiment of the high I/O semiconductor device package of FIG. 3a.

DETAILED DESCRIPTION OF THE INVENTION

For the purposes of this specification, a "high I/O semiconductor die" is defined as any die incorporating high-density I/O connection techniques, including double-sided dies, single-sided dies with low I/O pitch, dies with staggered rows of I/O pads, dies with "interior" (centrally located) I/O connection points, etc. "High I/O semiconductor device packages" are defined herein as semiconductor device packages designed to accept a high I/O semiconductor die. High I/O semiconductor packages include packages having greater than "n" pins, where "n" is, for example, 500, 600, 700, 800, 900, or 1000.

In general terms, the present invention provides package connections to high I/O semiconductor dies by providing at least a first plurality and a second plurality of bond sites on a substrate or leadframe to which electrical connections may be made. ("Bond sites" are formed by the ends of conductive traces or leads which extend inwardly towards a die-receiving area.) In leadframe-type packages (e.g., TAB) the first plurality and second plurality of bond sites are provided in two planes. In substrate-based packages, the first plurality and second plurality of bond sites may be provided either on the same surface of the substrate or on opposite surfaces of the substrate. When bond sites are provided on the same side of the substrate, one of the two pluralities of bond sites extends into a die-receiving area, while the other is spaced away from the die-receiving area.

Where double-sided semiconductor dies are used, at least two connection planes are provided. On leadframe-type embodiments, the two connection planes are provided by having a first set of "flat" leads and a second set of "bent" or "formed" leads. In substrate-based packages, the second (and third) connection planes are provided by extending bond wires from connection points on the die to bond sites on the surface(s) of the substrate. One embodiment provides for access to the surface of the substrate opposite the die via an opening in the substrate under the die.

Figure 1A:
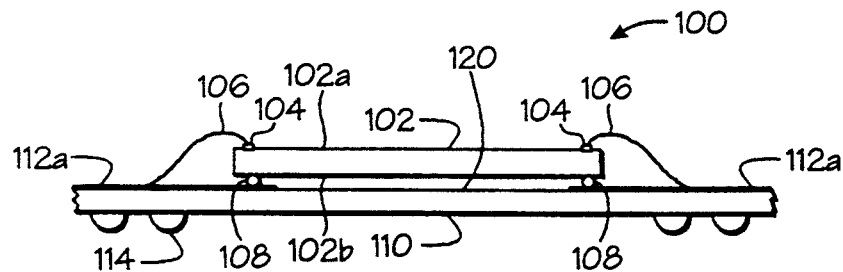
FIG. 1A is a cross-sectional view of a portion of a high I/O semiconductor device package according to the invention.

FIG. 1A is a cross-sectional view of a portion of a high I/O semiconductor device package 100, according to the present invention. In the Figure, a substantially planar substrate 110 has conductive traces 112a disposed on an upward facing (as depicted) major surface, and conductive bump contacts 114 disposed on a downward facing (as shown) major surface of the substrate 110. The conductive traces approach and extend into a die-receiving area 120 defined on the upward facing surface of the substrate. A double-sided semiconductor die 102 having conductive bump contacts 108 disposed on one (downward facing, as depicted) major surface and bond pads 104 disposed on an opposite (upward facing, as depicted) major surface is disposed in the die-receiving area. The bump contacts 108 are connected to inner ends of selected traces 112a, in a flip-chip type arrangement.

Figure 1B:
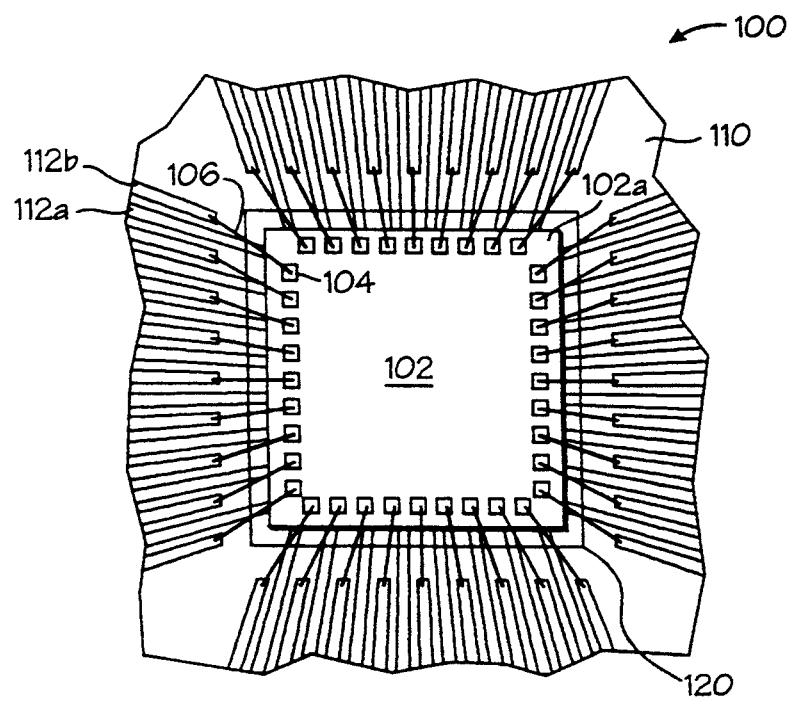

FIG. 1B is a top view of the high I/O semiconductor device package shown in FIG. 1a. In this view, the die receiving area 120 is shown generally as a dashed line. Interleaved between conductive traces 112a (to which the die 102 is connected by the conductive bump contacts 108) are other conductive traces 112b. Conductive traces 112a and other conductive traces 112b extend generally radially towards the die. Conductive traces 112a extend into the die-receiving area and under the die. The other conductive traces 112b, however, do not extend into the die-receiving area. Connections are made between the other conductive traces 112b and the bond pads 104 on the double-sided die 102 by bond wires 106. The bond wires are also shown in FIG. 1a.

Because the other conductive traces 112b do not extend inward towards the die as far as the conductive traces 112a, spacing of the traces is not as critical as it would be if all of the traces were extended into the die receiving area, or into any common area. In other words, since the traces 112b do not extend as far as the fanning-in traces 112a, they extend inward (towards the die) in spacious areas between the traces 112a.

Figure 1C:
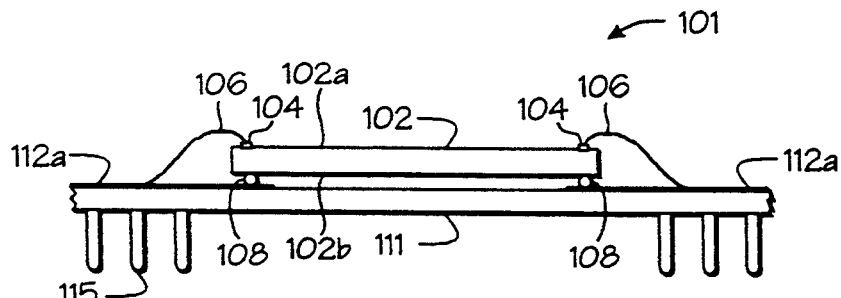

FIG. 1C is an alternate embodiment 101 of a semiconductor device package, similar in all regards to the embodiment of FIG. 1a except that a substrate 111 (similar to 110) has conductive pins 115 disposed on its downward facing (as depicted) surface rather than conductive bump contacts. In either case, the ball bumps 114 (FIG. 1a) and the pins 115 (FIG. 1c) are connected on a one-to-one basis to selected traces (e.g., 112a, 112b).

The substrate 110 (or 111) may be made of any suitable material, such as ceramic, FR4 (fiberglass) or BT resin. After assembly the die and the connections thereto may be encapsulated in a suitable encapsulant (e.g., epoxy, plastic) or sealed within a package body.

The bond pad spacing and conductive trace spacing are shown arbitrarily large in FIG. 1b, for illustrative clarity. While only 68 conductive traces (and electrical connections to the die) are shown, this technique is applicable to very large numbers of I/Os, for example, 500, 600, 700, 800, 900, or 1000 conductive traces and electrical connections to the die. One skilled in the art to which the present invention most nearly pertains will appreciate how to implement such high I/O based on the teachings of this patent.

FIGS. 1a–c are directed to a high I/O semiconductor device package based upon a substrate (e.g., 110, 111). The embodiment of FIGS. 2a–b, discussed hereinbelow, is directed to a leadframe-type package.

Figure 2A:
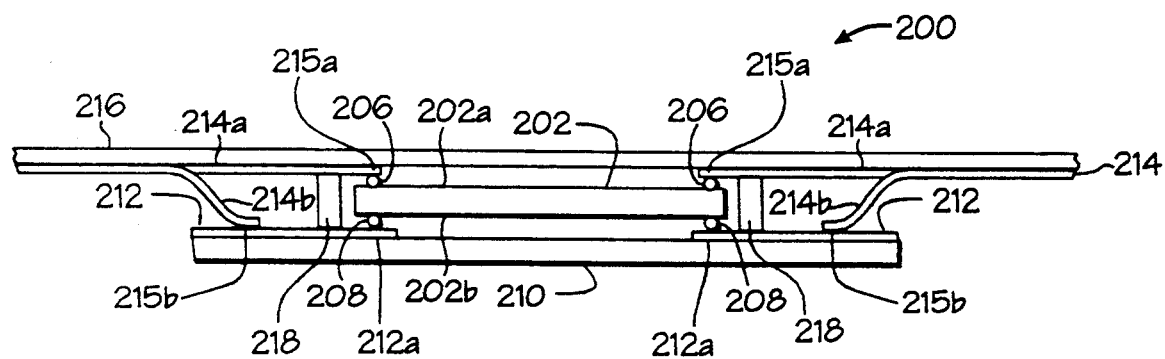
FIG. 2A is a cross-sectional view of a portion of a high I/O leadframe-type package according to the invention.

FIG. 2A is a cross-sectional view of a portion of a high I/O leadframe-type package 200, according to the present invention. The package is formed primarily of an assembly of a leadframe 214, a leadframe backing material 216, a double-sided semiconductor die 202, and a printed circuit board (PCB) type substrate 210. (Strictly speaking, in this and other embodiments disclosed herein, the die is not a part of the package, although it is certainly intended to be mounted and connected within the package.)

The leadframe backing material 216 may be a tape backing, such as mylar of kapton, similar to materials used in other packages. The double-sided semiconductor die 202 has first conductive bump contacts 206 disposed on a first major surface 202a, and second conductive bump contacts 208 disposed on a second major surface 202b. The leadframe 214 comprises a two-tier structure, whereby a first plurality of planar leads 214a extend inwardly in a single plane towards a die-receiving area (described hereinbelow with respect to FIG. 2b), and a second plurality of formed (bent out-of plane) leads 214b are bent downwards (as depicted). Inner ends 215a of the first leads 214a provide contact and mounting points to which the double-sided semiconductor die is connected and mounted via the first bump contacts 206. The planar substrate 210 has conductive traces 212 disposed along one (die-facing) surface thereof. Inner ends 215b of the second leads 214b provide contact and mounting points which are connected and mounted to the inner ends 215b of the traces 212 on the substrate 210, preferably by a re-flow soldering technique. The conductive traces 212 extend inwardly (towards the die) further than the ends of the second leads 214b, and connect to the second conductive bump contacts 208. The second bump contacts are preferably re-flow soldered to the inner ends of the conductive traces 212.

The completed assembly as shown has electrical leadframe connections to the first conductive bump contacts 206 on the double-sided semiconductor die 202 via the first planar leads 214a, and electrical connections to the second conductive bump contacts 208 via the second formed leads 214b and the conductive traces 212 on the substrate. An optional spacer 218, disposed between the leads 214a or the backing 216 and the substrate 210 or traces 212 can control (establish a predetermined) the spacing between the leadframe 214 and the substrate 210.

Preferably, the formed leads 214b have some degree of "springiness", to help make reliable mechanical and electrical contact to the conductive traces 212 during the assembly process, and to help absorb any variations in die position or conductive bump contact (e.g., 208) height.

Figure 2B:
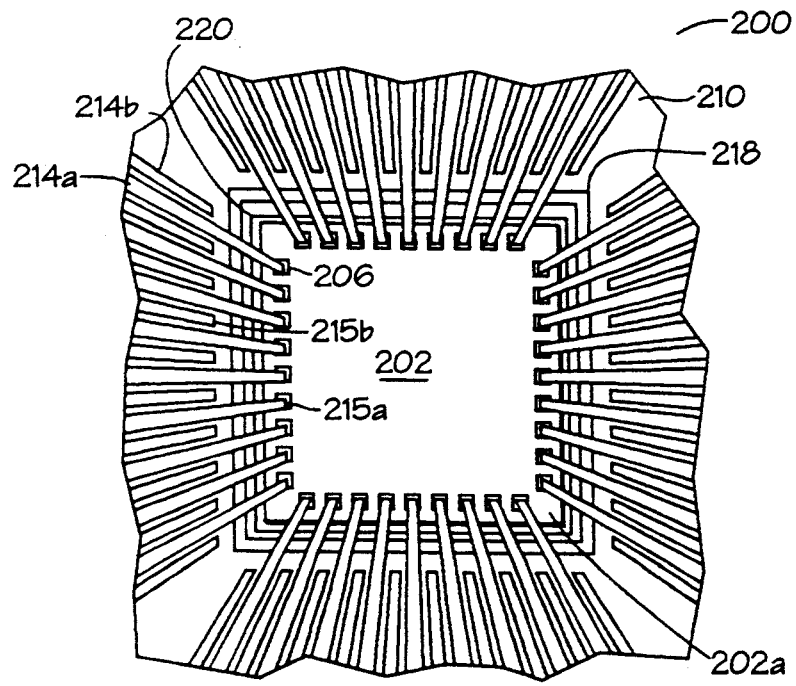

FIG. 2B is a top view of the package 200 shown in FIG. 2a. In this view, the backing material 216 and conductive traces 212 are omitted for illustrative clarity. The die receiving area 220 is shown generally as a dashed line.

In a manner similar to that shown in FIG. 1b, it is evident that the second plurality of formed leads (214b) extend only partially towards the die as compared with the first plurality of planar leads (214a). Hence, the second formed leads 214b are disposed in spacious areas between the first plurality of leads 214a. (In FIG. 1a, the second plurality of traces 112b were disposed in spacious areas between the first plurality of traces 112a.) In this regard, both embodiments (FIGS. 1b and 2b) provide for increased I/O packaging, especially of small dies, in a similar manner.

As i n the embodiment described hereinabove with respect to FIGS. 1a–c, the substrate 210 may be made of any suitable material, such as ceramic, FR4 (fiberglass) or BT resin. After assembly the die and the connections thereto may be encapsulated in a suitable encapsulant (e.g., epoxy, plastic) or sealed within a package body.

As in FIG. 1b, the conductive bump contact spacing and conductive trace spacing are shown arbitrarily large in FIG. 2b, for illustrative clarity. While only 76 conductive traces (and electrical connections to the die) are shown, this technique is applicable to very large numbers of I/Os, for example, 500, 600, 700, 800, 900, or 1000 conductive traces and electrical connections to the die.

Figure 3A:
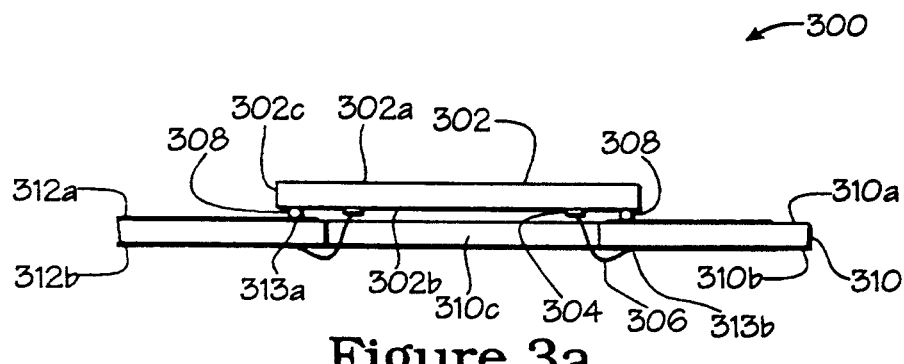
FIG. 3A is a cross-sectional view of a portion of another embodiment of a high I/O semiconductor device package according to the invention.

FIG. 3A is a cross-sectional view of a portion of another embodiment of a high I/O semiconductor device package 300, according to the present invention. In this case, the package is designed to accept a more conventional single-sided semiconductor die 302, with bond pads 304 and conductive bump contacts 308 disposed on only one (a first) major surface 302b of the die 302. The other major surface 302a, the back side of the die, is effectively "blank".

A first plurality of conductive bump contacts 308 are disposed on the first major surface 302b of the die near the outer edges (periphery) 302c of the die. A second plurality of bond pads 304 are disposed on the die 302 in more centrally located positions on the surface 302b, inward of the first bond elements 308. In this manner, the die 302 provides a large number of I/O pads (a high I/O die) by placing connection points (the bond pads 304 and conductive bump contacts 308) both along the periphery of and in an interior area of the major surface 302b. As in the previously-described embodiments, the high I/O die must be effectively and efficiently packaged.

A substantially planar substrate 310 has an upper surface 310a, a lower surface 310b, and an opening 310c. The opening is formed in an area corresponding to the die-receiving area (shown as 320 with respect to FIG. 3b). Upper conductive traces 312a are disposed along the upper surface 310a of the substrate 310 and lower conductive traces 312b are disposed along the lower surface 310b of the substrate 310. Both the upper conductive traces 312a and the lower conductive traces 312b fan in towards the opening 310c in a substantially radial fashion. The die 302 is larger than the opening 310c, and is mounted to the upper surface of the substrate.

The die is connected to the first plurality of upper conductive traces 312a via the conductive bump contacts 308 on the first major surface 302b of the die. These connections may be made by re-flow soldering.

Connections are established between the second plurality of lower conductive traces 312b and the bond pads 304 via bond wires 306 connected to and extending from the lower conductive traces 312b through the opening 310c to the 'interior' bond pads 304 on the die 302.

Figure 3B:
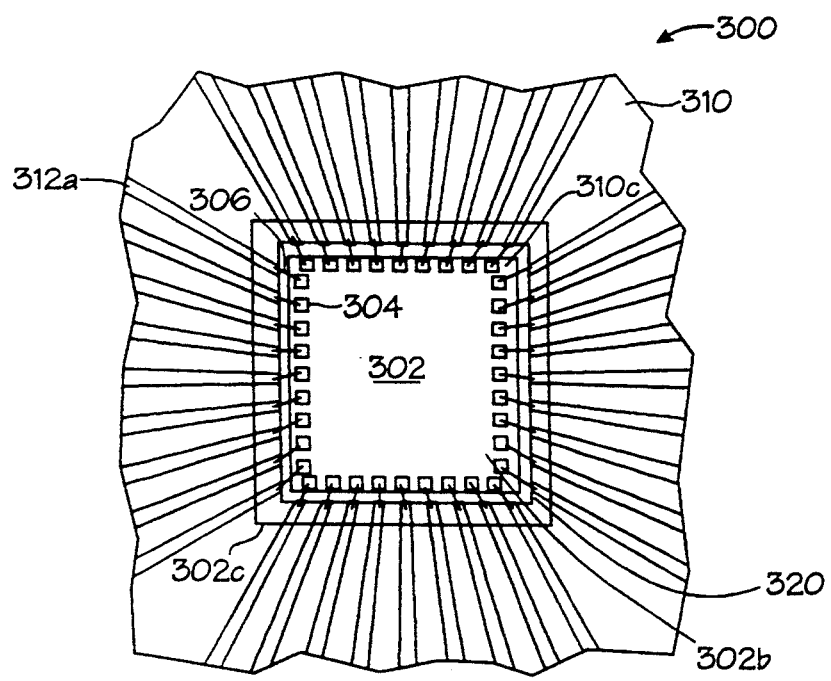

FIG. 3B is a bottom view of the package portion 300 shown in FIG. 3a. In this view, the die-receiving area 320 is shown generally as a dashed line, and the die is on the opposite side of the substrate 310 as viewed. The outer edge 302c of the die 302 is shown as a dashed line.

In the previous embodiments (e.g., FIGS. 1b and 1c, both pluralities of conductive lines (leads or traces) were on the same side of a substrate, and the second plurality of lines was shorter than the first plurality of lines. In this embodiment (FIG. 3a), the first and second pluralities of conductive lines are on opposite sides of the substrate. Both of these techniques facilitate high I/O connectivity to a die, especially to a small size die, without 'overcrowding' of the lines. Further, in all three embodiments (e.g., FIGS. 1a, 2a and 3a) there are essentially two distinct planes of connectivity between the conductive lines and the die. In FIGS. 1a and 2a, the two planes are very evident due to the exemplary double-sided dies illustrated. In FIG. 1a, the second plane is established by the bond wires 106. In FIG. 2a, the second plane is established by the bent leads 214b. In FIG. 3a, the exemplary die is single-sided, and the second plurality of lines is in a distinct plane offset from the first plurality of lines.

Figure 3C:
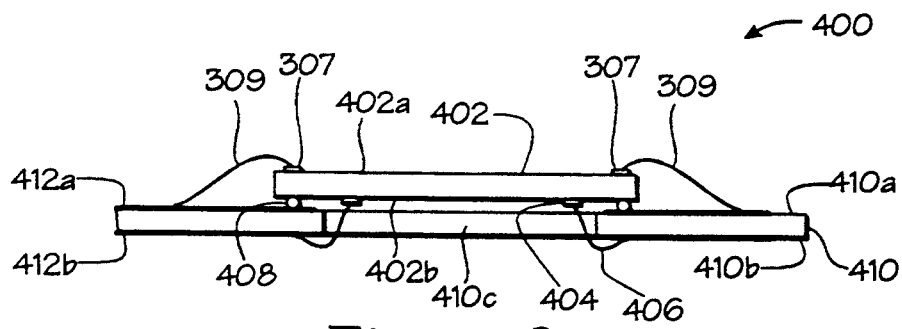

FIG. 3C is a cross-sectional view of an alternate embodiment 400' of high I/O semiconductor device package, similar in many respects to that (300) of FIG. 3a. In this case, a semiconductor device package is shown which combines features of the embodiments described with respect to FIGS. 1a and 3a. A double-sided semiconductor die 402, similar to the die 302 described with respect to FIG. 3a in that it has a first plurality of conductive bump contacts 408 (comparable to 308), and a second plurality of bond pads 404 (comparable to 304), both the first and second pluralities of die 'bond means' disposed on a first major surface 402b of the die. Additionally, however, the die 402 has a third plurality of bond pads 407 (comparable to 104) disposed on the second major surface 402a of the die.

The substrate 410 is similar to the substrate 310 described hereinabove with respect to FIGS. 3a and 3b, in that it has a first plurality of conductive traces 412a on one side 410a of the substrate 410, and a second plurality of conductive traces 412b on an opposite side 410b of the substrate, and an opening 410c (similar to 310c.

In a manner similar to that shown in FIG. 1b, a portion (compare 112b) of the traces on the one side of the substrate are shorter than another portion (compare 112a) of these traces. More particularly, every other one of the traces 412a extend to underneath the die to connect to the balls 408, in a manner similar to the traces 112a in FIG. 1b. This is the so-called first plurality of conductive lines. Another, portion of the traces 412a, comparable to 112b, are interleaved between the first plurality of conductive lines, and is shorter than the first plurality of conductive lines. This is the so-called second plurality of conductive lines. In other words, the embodiment of FIG. 3c combines the best features of the embodiments of FIGS. 1a and 3a, and allows for even higher numbers of I/O connections, especially with respect to small dies having high I/O count. Bond wires 409 (similar to 106) connect the bond pads 407 to respective traces 412a. Bond wires 406 (similar to 306) connect the bond pads 404 to respective traces 412b.

The substrate (310 or 410) may be made of any suitable material, such as ceramic, FR4 (fiberglass) or BT resin. After assembly the die and the connections thereto may be encapsulated in a suitable encapsulant (e.g., epoxy, plastic) or sealed within a package body. These embodiments may be provided with pins, ball bumps, or the like, as was described with respect to FIGS. 1a and 1c.

The bond pad spacing and conductive trace spacing are shown arbitrarily large in FIG. 3b. While only a small number of conductive traces (and electrical connections to the die) are shown, this technique is applicable to very large numbers of I/Os, for example, 500, 600, 700, 800, 900, or 1000 conductive traces and electrical connections to the die.

The present invention is directed to techniques for providing a large number of 'internal' connections to "high I/O" dies in semiconductor device packages, and is not particularly concerned with other aspects of packages, such as 'external' package connections (e.g., external pins, leads, bump contacts, or pads on the exterior of a semiconductor device package). Numerous techniques are known in the art for providing large numbers of such external connections over a relatively large area (such as an external surface of the body of a semiconductor device package).

It is within the scope of the present invention to apply the techniques described hereinabove to an interior portion of a semiconductor device package having any type of external connections, package body type, or encapsulation technique.

What is claimed is:

1. A method of making a high number of connections to a semiconductor die, comprising:

providing a substrate having two opposite surfaces, one of which is a first surface, another of which is a second surface, a die-receiving area defined on a the first surface of the substrate;

providing a first plurality of conductive lines on the first surface of the substrate;

providing a second plurality of conductive lines on the substrate;

providing a first plurality of bond sites around a periphery of a one surface a semiconductor die;

providing a second plurality of bond sites around a periphery of an other surface of the semiconductor die, the other surface of the die being opposite the one surface of the die;

extending the first plurality of conductive lines to within a die-receiving area where the die is to be mounted on the first surface of the substrate;

mounting the die to the first surface of the substrate so that the first bond sites are connected, by first connections, to the first conductive lines; and connecting the second bond sites, by second connections, with bond wires to the second plurality of conductive lines.

2. A method according to claim 1, wherein:
the first connections are flip-chip type connections; and
the second plurality of conductive lines extends between the first conductive lines and only partially towards the die receiving area.

3. A method according to claim 1, wherein:
the second plurality of conductive lines are disposed on the first surface of the substrate between the first plurality of conductive lines.

4. A method according to claim 1, wherein:
the first bond sites are bond bumps;
the second bond sites are bond pads;
the first connections are flip-chip type connections between the first plurality of conductive lines and the bond bumps; and
the second connections are effected by bond wires between the second plurality of conductive lines and the bond pads.

5. A method according to claim 1, wherein:
the second plurality of conductive lines are on the same surface of the substrate as the first plurality of conductive lines and at a distance from the die-receiving area are bent out-of-plane, away from the surface of the substrate, so as to have free ends, and further comprising:

providing a second substrate having conductive traces, one end of which are connected to the free ends of the second plurality of conductive lines, and connecting another end of of the conductive traces to the second set of bond sites on the die.

6. A method according to claim 5, further comprising:
providing standoff elements between the substrate and the second substrate to establish a predetermined spacing between the substrate and the second substrate.

7. A method according to claim 1, wherein:
the number of connections effected between the first conductive lines and the first bond sites, plus the number of connections effected between the second conductive lines and the second bond sites is at least 500.

8. A method according to claim 1, wherein:

the number of connections effected between the first conductive lines and the first bond sites, plus the number of connections effected between the second conductive lines and the second bond sites is at least 900.

9. A method of making a high number of connections to a semiconductor die, comprising:
providing a substrate having two opposite surfaces, one of which is a first surface, another of which is a second surface, a die-receiving area defined on a the first surface of the substrate;
providing a first plurality of conductive lines on the first surface of the substrate;
providing a second plurality of conductive lines on the second surface of the substrate, wherein the second plurality of conductive lines is distinct from the first plurality of conductive lines;
providing an opening through the substrate and an area where a semiconductor die is to be mounted to the first surface of the substrate;
providing a first plurality of bond sites around the periphery of one face of a semiconductor die;
providing a second plurality of bond sites on the one face of the semiconductor die inward, towards the center of the die, from the first plurality of bond sites;
extending the first plurality of conductive lines to within the area where the semiconductor die is to be mounted to the first surface of the substrate;
mounting a die to the first surface of the substrate, over the opening, so that the first bond sites are connected by first connections to corresponding ones of the first conductive lines, and so that the second bond sites are exposed within the opening through the substrate; and
connecting the second conductive lines by second connections to the second bond sites with bond wires, through the opening in the substrate.

10. A method according to claim 9, wherein:
the first plurality of conductive lines extends to within the die-receiving area; and
the second plurality of conductive lines extends to an edge of the opening through the substrate.

11. A method according to claim 9, wherein:
the second set of bond pads are provided in a central area of the one side of the semiconductor die.

12. A method according to claim 9, wherein:
the first bond sites are bond bumps;
the second bond sites are bond pads;
the first connections are flip-chip type connections between ends of the first plurality of conductive lines and the bond bumps; and
the second connections are effected by bond wires between the second plurality of conductive lines and the bond pads.

13. A method according to claim 9, further comprising:
providing a third plurality of conductive lines on the one surface of the substrate;
providing a third plurality of bond sites on a side of the die opposite the first and second bond sites; and
connecting the third plurality of bond sites to the third plurality of conductive lines.

14. A method according to claim 13, wherein:
the third plurality of conductive lines extend only partially towards the opening and terminate outside of the area where the die is mounted, and are disposed between the first conductive lines.

15. A method according to claim 9, wherein:
the number of connections effected between the first conductive lines and the first bond sites, plus the number of connections effected between the second conductive lines and the second bond sites is at least 500.

16. A method according to claim 9, wherein:
the number of connections effected between the first conductive lines and the first bond sites, plus the number of connections effected between the second conductive lines and the second bond sites is at least 600.

17. A method according to claim 9, wherein:
the number of connections effected between the first conductive lines and the first bond sites, plus the number of connections effected between the second conductive lines and the second bond sites is at least 700.

18. A method according to claim 9, wherein:
the number of connections effected between the first conductive lines and the first bond sites, plus the number of connections effected between the second conductive lines and the second bond sites is at least 800.

19. A method according to claim 9, wherein:
the number of connections effected between the first conductive lines and the first bond sites, plus the number of connections effected between the second conductive lines and the second bond sites is at least 900.

20. A method according to claim 9, wherein:
the number of connections effected between the first conductive lines and the first bond sites, plus the number of connections effected between the second conductive lines and the second bond sites is at least 1000.

21. A method according to claim 13, wherein:
the number of connections effected between the first conductive lines and the first bond sites, plus the number of connections effected between the second conductive lines and the second bond sites, plus the number of connections effected between the third conductive lines and the third bond sites is at least 500.

22. A method according to claim 13, wherein:
the number of connections effected between the first conductive lines and the first bond sites, plus the number of connections effected between the second conductive lines and the second bond sites, plus the number of connections effected between the third conductive lines and .the third bond sites is at least 900.

23. A method of making a high number of connections to a semiconductor die, comprising:
providing a substrate having a die-receiving area defined on a surface thereof;
providing at least two distinct pluralities of conductive lines on at least one surface of the substrate; and
providing at least two distinct pluralities of connections between the conductive lines and corresponding at least two sets of bond sites on at least one face of a semiconductor die; wherein
each of the sets of bond sites are sized and spaced as close to one another of the same set as possible, and the bond sites of one set imposes no constraints on size and spacing of the bond sites of the other set, thereby, for a given size die, at least doubling the number of connections that can be made to the die.

* * * * *